United States Patent [19]

Mortara

[11] Patent Number: 4,800,364
[45] Date of Patent: Jan. 24, 1989

[54] ANALOG-TO-DIGITAL CONVERTER UTILIZING VERNIER TECHNIQUES

[76] Inventor: David W. Mortara, 8450 N. River Rd., Milwaukee, Wis. 53217

[21] Appl. No.: 57,686

[22] Filed: May 27, 1987

Related U.S. Application Data

[63] Continuation of Ser. No. 754,775, Jul. 15, 1985, abandoned.

[51] Int. Cl.$^4$ .............................................. H03M 1/46
[52] U.S. Cl. ................................... 341/131; 364/577; 341/155
[58] Field of Search ................. 340/347 AD, 347 CC, 340/347 M, 347 C; 358/123, 138; 307/360, 361; 364/577

[56] References Cited

U.S. PATENT DOCUMENTS 3,976,869  8/1976  Stella et al. ......................... 364/603
4,447,803  5/1984  Crosby et al. ................. 340/347 CC

OTHER PUBLICATIONS

The Engineering Staff of Federal Scientific Corporation, Dithering Increases Dynamic Range-, 8/1973, pp. 1-8.
The Engineering Staff of Analog Devices, Inc., Analog-Digital Conversion Handbook, 6/1972, p. II-25, 26 and 51.

Primary Examiner—T. J. Sloyan
Attorney, Agent, or Firm—Mason, Kolehmainen, Rathburn & Wyss

[57] ABSTRACT

An analog-to-digital converter (ADC) controlled in a manner to increase its precision. The signal to be digitized is one input to an analog signal summing means whose output is the input to the ADC. A stepped or dither voltage signal is applied to the other summing means input during each analog signal sampling period of the ADC. The dither voltage steps are equal to the voltage equivalent of one ADC count plus 1/N where N is the number of steps per ADC count chosen to obtain a desired degree of precision in the digital signals that are output by the ADC. The dither voltage step that is combined with the current analog signal sample in the summing means amounts to displacing the sample in steps within each count of the ADC. The ADC converts each combined signal during a sampling interval to a succession of binary digital values which are summed. The result of the summation is a binary number having a value that corresponds more precisely to the true value of the analog signal samples than would be the case if they were converted directly by the ADC.

21 Claims, 1 Drawing Sheet

ANALOG-TO-DIGITAL CONVERTER UTILIZING VERNIER TECHNIQUES

This application is a continuation of application Ser. No. 754,775, filed July 15, 1985, now abandoned.

BACKGROUND OF THE INVENTION

The invention disclosed herein is for improving the resolution or precision of analog-to-digital converters. For example, the invention makes it possible to obtain with a nominally 8-bit converter substantially the precision that could otherwise only be obtained with a 12-bit or greater converter.

As is well known, an analog-to-digital converter (ADC) takes successive samples of an analog signal and converts them to digital values. It is also known that the cost of an ADC increases in proportion to its conversion speed and in proportion to the number of bits into which it quantizes each sample. When high resolution is required, the electronic circuit designer is compelled to select a more precise and costly converter.

The accuracy and precision of an integrated circuit ADC, like most if not all of measuring instruments, depends on the number of parts into which the measurement unit is subdivided on the measuring scale. Consider an ordinary straight scale one meter in length on which the smallest subdivisions are marked one centimeter apart, that is, the centimeters are not divided into millimeters. If this scale is laid with its zero end at the left edge of an object and the opposite end of the object falls between centimeters 30 and 31, for example, the true measurement can only be guessed so precision within one centimeter is the best obtainable. Comparable conditions apply to ADCs. If a ADC has the capability for resolving an analog signal sample into an 8-bit binary number or 256 levels in decimal number terms, one part in 256 is the best resolution obtainable when a ADC is used in the conventional way ADCs always have some error as is known. For instance, if an analog signal sample of a fixed amplitude were digitized repeatedly by a given ADC, the resulting binary numbers would most likely differ in their least significant bits and probably also in higher order bits.

In some mechanical measuring devices, the resolution of the finest division on the scale that can be read with certainty is improved by use of a vernier. The verneir scale consists of a number of divisions corresponding to the fraction of the main division required. Suppose a one meter scale is graduated in millimeters and one desires to measure to within tenths of a millimeter. The length of the vernier scale is made one less than a similar number of divisions on the main scale so on the vernier scale ten divisions is equal to nine divisions of the main scale. Thus, each vernier division may be one tenth short of a main scale division. Conversely, each main scale division is ten-ninths of a vernier scale division. The vernier scale is mounted for sliding next to the main scale. Thus, to read to tenths of the main scale, one progresses along the vernier scale from zero until a graduation mark on the vernier scale aligns with a graduation mark of the main scale. For example, if the third vernier graduation above zero aligned with one on the main scale, an amount equal to three-tenths of a main scale division would be added to the nearest accurately readable integer number marked under the fraction or seven-tenths of a division would be subtracted from the next integer number over the fractional part. What one is actually doing is adding or subtracting a constant offset, one-tenth in this example, as one progresses along the vernier scale, summing the number of vernier scale divisions and dividing by the number (10 in this example) of parts into which a main scale division is to be divided.

SUMMARY OF THE INVENTION

The present invention is based on the perception that an analog-to-digital converter can be operated or controlled in a manner analogous to using a vernier with an ADC that is limited in the number of bits into which it can resolve analog signal samples. By way of example that can be demonstrated mathematically, an 8-bit ADC can be controlled to yield digital values having the precision of a twelve bit ADC, in accordance with the invention.

A further mechanical analogy to the invention is as follows. Assume a one-meter long scale is available and it is graduated only in centimeters. A rod to be measured is actually 26 cm and 4 mm long. The user desires to measure to within the nearest millimeter, but millimeter divisions are not on the scale. The scale is placed on a rod with its zero end at one end of the rod. The other end of the rod would fall between 26 and 27 cm. The length of the rod would be measured as 26 cm with no estimate of the fractional centimeter remainder—in close analogy to the action of an ADC when the analog input falls between two successive output values.

Suppose, however, a measurement of the length of the rod accurate to 1/10 cm is required. As with the vernier, a second scale, marked in 11/10 cm units can be used in conjunction with the first meter scale to gain 1/10 cm accuracy. The measurement of the length of the rod would proceed as follows:

Step 1. Place one end (the left, for example) of the rod at the zero point of the meter scale, and read the length of the rod. The result is 26 cm.

Step 2. Using the 11/10 cm scale, displace the left end of the rod further to the left by 11/10 cm, and read the position of the right end of the rod using the original scale. The result is 25 cm.

Step 3 through 10. Continue displacing the left end of the rod in 11/10 cm steps, and reading the position of the right end, with results of 24, 23, 22, 20, 19, 18, 17 and 16 cm. No value of 21 cm is recorded as movement of the meter scale by 11/10 cm from the reading of 22 cm (with no excess) results in a recording of 20 cm (and an unmeasured excess of 9 mm).

Step 11. Sum the results of step 1–10, and divide by 10, and add the average displacement of the left end of the rod ($9 \times 11/10$ cm $\times \frac{1}{2} = 4.95$ cm) plus the average rounding error of each measurement (0.5 cm). The result is 26.45 cm which is the correct result within the desired accuracy.

To complete the analogy between the invention and the mechanical example cited above, one may suppose that the one-meter scale is only imperfectly graduated in centimeters, that is, the true separation of each successive mark is not exactly 1.0 cm, but differs from this desired value by amounts up to a specified limit commonly referred to as the differential non-linearity.

The potential for non-linearity is the reason for taking 11/10 cm steps in the example above. In the absence of non-linearity, steps of 1/10 cm would work equally well. But if a particular mark, say the 26 cm mark above is misplaced, then all measurements based on it are similarly in error. In the described invention, each successive step causes the measurement to be taken on a typically adjacent interval. By spanning a cluster of adjacent intervals, the effect of misplacement of interval limits is reduced. A single misplaced interval limit typically affects only one of ten measurements. Since the final result is obtained by dividing the sum of measurements by ten (in the example), the error is reduced ten-fold.

In accordance with the invention, the principle is applied to an 8-bit ADC. Briefly, the analog signal to be converted, such as an electrocardiograph (ECG) signal, is one input to an operational amplifier. The other input is a reference or bias voltage signal. The output of the operational amplifier is a signal biased so it will be within the scale or dynamic range of the ADC that is used. The output signal from this operational amplifier is one input to another operational amplifier which operates as a summing amplifier. The other summing amplifier input is a dither or stepped voltage.

The dither voltage signal may be obtained by various means such as by using a binary counter to drive a resistor network which is a procedure used in some types of DAC systems. A resistor having a value of R is connected to the counter pin on which the most significant bit (MSB) appears. Resistors having values of 2R, 4R, 8R and etc. are connected to the other output pins of the counter and the highest valued resistor is connected to the least significant bit (LSB) pin of the counter. The outer ends of the resistors are connected in common to a scaling resistor which is a voltage divider when considered in conjunction with any of the other resistors. As the counter counts up under clock control, the signal on the scaling resistor goes up in steps and is designated a dither voltage.

The dither voltage steps correspond to the movement of the measuring scale in the mechanical measuring instrument examples given earlier. The analog dither voltages are applied to the other input of the summing amplifier. The analog voltage output signals from the summing amplifier are input to the ADC which converts each analog input signal sample that is combined with a dither voltage step to a corresponding digital value. The latter values are supplied to a summing device such as an adder which sums the digital values. The result of the summation is a precise digital representation of the particular analog signal sample.

An embodiment of the invention will now be described in detail in reference to the drawing.

DESCRIPTION OF A PREFERRED EMBODIMENT

Figure 1:
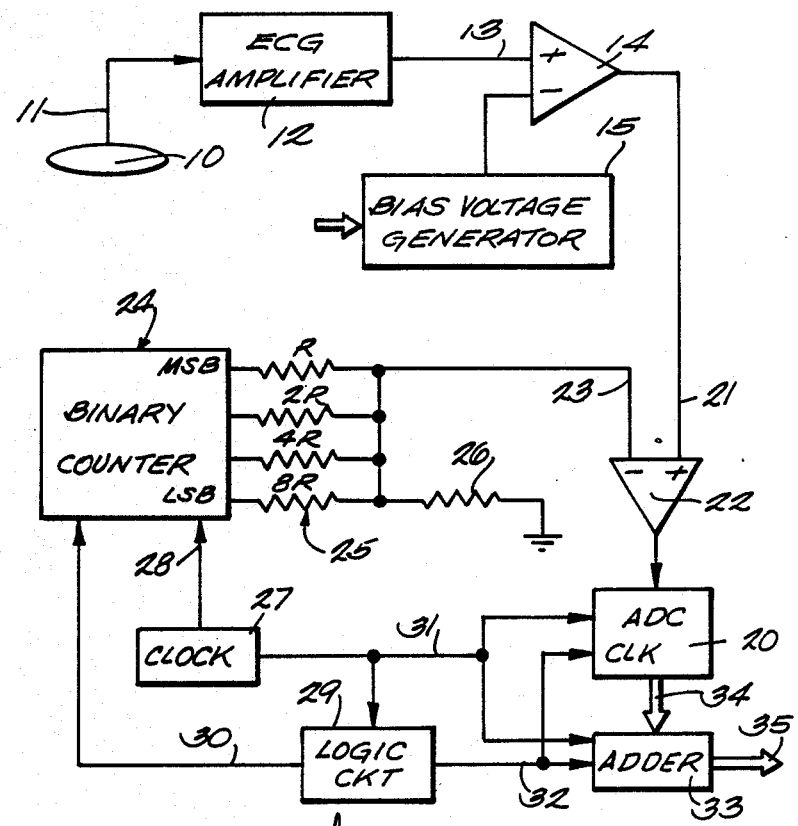
FIG. 1 is a block diagram of a biomedical system in which the new analog-to-digital converter system is utilized.
Figure 3:
FIG. 3 shows an electrocardiograph (ECG) analog signal that is typical of signals that can be converted to precise digital values with the new converter system.

Referring to FIG. 1, a body from which a biomedical signal is to be derived is represented by the ellipse marked 10. Since use of the new analog-to-digital converter (ADC) system is especially valuable in electrocardiography, the biomedical signal to be digitized will be taken as the analog ECG signal depicted in FIG. 3. In FIG. 1, the analog ECG signal is input by way of line 11 to a conventional ECG amplifier 12. The output of ECG amplifier 12 is, by way of line 13, one input to an operational amplifier 14 which is operative to bias or introduce an offset to the ECG signal. The bias voltage or reference signal is produced with a bias voltage generator 15. The latter is simply a circuit that allows selection of any one several bias or reference voltage levels. The bias voltage establishes the reference voltage level for the ECG signal. The level is set so that the ECG signal will lie within the dynamic range of ADC 20 to which the ECG signal is supplied after the signal is modified as will be explained.

The biased ECG signal that is output from amplifier 14 is input by way of line 21 to an operational amplifier operating as a summing amplifier 22.

Assume for the sake of example that the requirements of other parts of a heart monitoring system such as a part which measures the time interval between R-wave peaks could preferably be furnished with digitized ECG signals having high resolution or precision such as could only be obtained by using a high grade linear ADC that provides 12-bit resolution. As will be shown, the invention makes it possible to use a less costly and quite non-linear 8-bit ADC 20 and still obtain precision equivalent to a 10-bit or a 12-bit or an even higher resolution ADC. The objective of the example given herein will be to obtain 12-bit resolution or precision from a nominally 8-bit ADC 20.

Referring to FIG. 1, besides the biased ECG signal input on line 21 to summing amplifier 22 there is another input 23 for a stepped voltage or dither voltage, as it is herein called, to summing amplifier 22. The dither signal is a stepped voltage signal developed with a digital-to-analog converter means which, in the illustrated embodiment, is comprised of an integrated circuit binary counter 24, a ladder resistor network 25 and a divider resistor 26. This arrangement is generally known but its operating parameters and the manner in which it cooperates with other elements in the system was not known heretofore.

A clock pulse generator 27 is provided. It delivers a clock pulse train, by way of line 28, to binary counter 24. Logic circuitry 29 provides signals by way of line 30 for causing the counter 24 to starting counting clock pulses and to reset the counter to zero count. The clock pulse train is supplied to logic circuit 29 and ADC 20 by way of line 31. Signals for setting and resetting ADC 20 at the start and end respectively, of each analog signal sampling interval are provided from the logic circuit 29 over line 32. By way of example and not limitation, in an actual embodiment of the invention used for digitizing ECG analog signals, the clock pulse frequency to the binary counter 24 is 4,000 Hz.

The arrangement in FIG. 1 also includes a binary number adding means identified as an adder and used for purposes which will be discussed later. The adder is also provided with control signals from the logic circuit by way of line 32. The clock pulse train is also supplied to adder 33 by way of line 31.

The manner in which the FIG. 1 system functions to permit using an ADC 20 that is rated to convert analog signal samples to digital values having a low number of bit places while still obtaining the precision of a converter that is rated for resolving analog signal samples into binary numbers having a greater number of bits will now be described. For clarity that is obtainable by exemplifying a function with actual numbers, ADC 20 is assumed to be rated by its manufacturer to convert any sample of an analog signal into a binary number having 8-bits. If the maximum amplitude of the analog signal which the ADC 20 is capable of converting is input to the ADC, its binary number output will be all 1's which is equivalent to 255 signal levels in the decimal system. Thus, in this example, the smallest division of the analog signal which the ADC is rated to measure is 1/256 of the analog signal. This is equivalent to one count or quantization step by the ADC. One count division is analogous to the coarse scale or the one centimeter divisions on the meter scale discussed earlier where the objective was to get 1 mm resolution even though the scale was divided grossly into centimeters.

At this juncture it should also be remembered that most, if not all, ADC's do not count up linearly, but the invention compensates for this problem too.

In FIG. 1, binary counter 24 cooperating with resistor network 25 and divider or scaling resistor 26 provides the minor divisions in which an ADC count will divided to to obtain high resolution or precision from the ADC.

Figure 2:
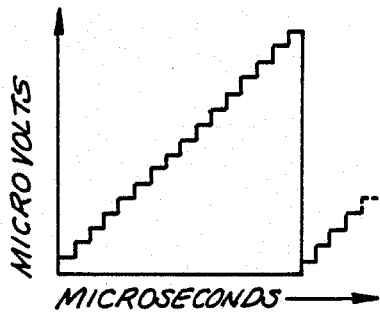
FIG. 2 is a timing diagram that is useful for describing a functional feature of the invention.

When ADC 20 is triggered to start converting a selected analog signal sample to a binary number value, the counter 24 starts counting clock pulses. It is not the count of the clock pulses that is significant, it is the production of a voltage step for each counter count as indicated in FIG. 2. As the output pins of counter 24 to which the resistors R to 8R are connected change states or count up, the current flowing through the divider resistor increases correspondingly. Hence, a stepped voltage signal appears on the top of resistor 26 and it is applied to input 23 of summing amplifier 22 in which the voltage steps are added to, although they might be subtracted from, the existing analog voltage sample. Assume that in this case the voltage steps are added to the incoming analog voltage sample which is stable during a sampling interval.

The values of network resistors R to 8R are high compared to the resistance of the scaling resistor 26. By way of example, and not limitation, the scaling resistor value may be about 0.04% of the ohmic value of R. In one actual converter system, for example, R has a value of 200 kilohms. Basically, a scaling resistor 26 is chosen that provides analog voltage steps which are each a complex fraction of one ADC count for a unit change in the output of counter 24. Expressed mathematically, the desired step signal change per step is:

$$1 \text{ ADC count} + 1/N \text{ ADC count}$$

where N=a number of minor divisions or steps. Greater precision is obtained from ADC 20, in accordance with invention, as N or the number of steps per sampling interval is increased. To give a numerical value used in an actual ECG signal converter system, a scaling resistor 26 is used to give voltage steps or minor measurement divisions that are 17/16 of 1 ADC count for a unit change in the counter 24 output. This yields 12-bit precision from ADC 20 if the latter is nominally an 8-bit converter. In terms of voltage, where an 8-bit ADC is used, one ADC count would be equivalent to 1/256 of maximum amplitude analog input signal that the ADC is capable of quantizing. In the numerical example herein, on count 1 of the counter the output analog signal from summing amplifier 23 is the analog input signal to input 21 displacing by 17/16 of one ADC count. The same thing happens for every count. In one practical embodiment, for example, in which and ADC count is equivalent to about 2.35 microvolts on the analog signal range and there are 16 minor divisions to get 12 bit ADC precision, each voltage step of 17/16×2.35 amounts to 2.5 microvolts per step. The 16 steps depicted in the FIG. 2 diagram would then total 40 microvolts. At the illustrative 4000 Hz counting rate for the counter, each step is made in 250 microseconds and the total number of steps per ADC count is made in 4 ms. Sampling is continuous and the ADC starts converting a new sample of the ECG analog signal every 4 ms. Since the ECG sample is displaced or shifted by a fractionally greater amount than 1 ADC count, it should now be understood how the process negates ADC non-linearity between its counts. The displacement extends beyond the range of variances or non-linearity of the ADC counts per unit of analog signal.

As ADC 20 counts up with each step voltage the resulting binary values of 8-bit width in this numerical example, are supplied by way of a bus 34 to an adding means such as digital adder 33 which adds the 16 incrementally increased analog signal sample values which have been converted to digital values by ADC 20. The result of the addition is a binary number that corresponds in magnitude more closely to the true value of the analog signal sample than would be obtained if ADC 20 made the customary straight forward conversion from analog signal samples to corresponding digital signal values. The digitized samples are output on bus 35 from the adder to other part, not shown, of the system such as a part that displays the signals on a cathode ray tube monitor or a part that measures the time interval between ECG signal R-wave peaks or the like.

The reader may have observed that unlike the examples given earlier for obtaining vernier accuracy with a mechanical measuring instrument, it is not necessary to divide the binary numbers output from ADC 20 by the number of minor division steps through which each sample is displaced. This is so because each of the digital summations is proportional to the amplitude of the ECG signal which it represents. Dividing by any number would not change the proportionality of any sample relative to the others.

Observe also that the step voltage applied to the input 23 of summing amplifier 22 from the digital-to-analog converter based on counter 24 do not have to be in constantly ascending order. The "N" number of steps must be made but they can be made in any order. This is so because all of the displaced analog signal values that are output from ADC 20 are added together in adder 33 and the adder is indifferent to the order in which the digital conversions are supplied to it.

The displacements of the ECG samples have been treated as incremental additions to the samples herein. This is analogous to the major division mark on a mechanical scale that is read to indicate the length of a rod grossly being the mark that falls short of the end of the rod with the next major division mark being beyond the end of the rod. In such case, the finer division displacement increments can be made by pushing the scale in one direction or the other. If the scale is incremented away from its zero end so that the mark inside of the rod end goes beyond the end. The increment are added to the lower major division value. If the scale is moved oppositely, the increments are subtracted from the next major division on the scale beyond the end of the rod. Correspondingly, the voltage steps or minor divisions supplied to input 23 of the summing amplifier may be subtracted from the analog signal sample if the ECG signal is appropriately biased. The converted binary results from ADC 20 can still be added in adder 33. In some applications the user of the described system might want to use an 8-bit ADC 20 but would be satisfied with conversion to the equivalent of 10-bit rather than 12-bit or higher precision. For instance, if logic devices down the line from the converter have 10-bit precision, supplying them with digital values of greater precision does not improve accuracy. Thus, if precision can be lower, fewer voltage steps can be used. For instance, if 10-bit precision instead of 12-bit precision were sought with an 8-bit ADC 20, blocking of counter 24 can be changed so it counts up to 10 steps and resets. In such case, each step would be a voltage corresponding to 11/10 of 1 ADC count. Of course, as has been shown, the greater the number of small division steps by which the ECG sample is displaced, the greater will be the precision obtained from the chosen ADC.

I claim:

1. An analog-to-digital signal conversion system comprising:
   analog-to-digital converter having an input for receiving an analog signal and an output for providing a digital representation thereof, said digital representation having a predetermined resolution;
   means for generating a signal having a plurality, N, of discrete amplitude levels, the difference between the closest in amplitude of the amplitude levels being substantially equal to (N+1)/N times the predetermined resolution of the analog-to-digital converter;
   means for additively applying said N discrete amplitude level signal and an analog signal to be converted to the input of the analog-to-digital converter to provide at the output thereof N digital representations, each corresponding to the sum of the analog signal to be converted and one of said N discrete levels; and
   means for combining said N digital representations to provide a digital representation of the analog signal being converted with a greater resolution than the predetermined resolution of the analog-to-digital converter.

2. The analog-to-digital conversion system recited in claim 1 wherein said discrete level signal generating means includes means for generating a stepped signal.

3. The analog-to-digital conversion system recited in claim 1 wherein said combining means includes means for additively combining said digital representations.

4. The analog-to-digital conversion system recited in claim 1 wherein N is equal to 10.

5. The analog-to-digital conversion system recited in claim 1 wherein N is equal to 16.

6. In a conversion system employing an analog-to-digital converter for converting an analog signal to a corresponding digital signal, the analog-to-digital converter having a predetermined resolution, and means for providing a digital representation of the analog signal with a greater resolution than the resolution of the analog-to-digital converter, the improvement comprising:
   means for generating a signal having a plurality, N, of substantially equally spaced discrete amplitude levels, the difference in amplitude between the closest in amplitude of the discrete amplitude levels being substantially equal to (N+1)/N times the resolution of the digital-to-analog converter;
   means for additively combining the discrete amplitude level signal and the analog signal to provide a combined signal to the analog-to-digital converter;
   means for rendering the analog-to-digital converter operative to provide a digital representation of the combined signal for each discrete amplitude level of the discrete amplitude level signal; and
   means for additively combining the digital representations of the combined signal to provide the digital representations of the analog signal.

7. The improvement recited in claim 6 wherein said discrete level signal generating means includes means for generating a stepped signal.

8. The improvement recited in claim 6 wherein N is equal to 10.

9. The improvement recited in claim 6 wherein N is equal to 16.

10. An analog-to-digital signal conversion system comprising:
    an analog-to-digital converter having an input for receiving an analog signal and an output for providing a digital representation thereof, said digital representation having a predetermined least significant bit of resolution;
    means for generating a signal having a plurality, N, of discrete equally spaced amplitude levels, the difference between the closest in amplitude of the amplitude levels being approximately equal to the least significant bit of the analog-to-digital converter and different from the least significant bit by an amount substantially equal to 1/N times the least significant bit of the analog-to-digital converter;
    means for additively and successively applying each of said N discrete amplitude levels of the discrete amplitude level signal and an analog signal to be converted to the input of the analog-to-digital converter to provide at the output thereof N digital representations, each corresponding to the sum of the analog signal to be converted and one of said N discrete amplitude levels; and
    means for additively combining said N digital representations to provide a digital representation of the analog signal being converted with a greater resolution than the least significant bit of the analog-to-digital converter.

11. The analog-to-digital conversion system recited in claim 10 wherein said discrete level signal generating means includes means for generating a stepped signal.

12. The analog-to-digital conversion system recited in claim 10 wherein N is equal to 10.

13. The analog-to-digital conversion system recited in claim 10 wherein N is equal to 16.

14. In a conversion system employing an analog-to-digital converter for converting an analog signal to a corresponding digital signal, said analog-to-digital converter having a predetermined least significant bit of resolution, and means for providing a digital representation of the analog signal with a greater resolution than the least significant bit of the analog-to-digital converter, the improvement comprising:
    means for generating a signal having a plurality, N, of substantially equally spaced discrete amplitude levels, the difference in amplitude between the closest in amplitude of the discrete amplitude levels being approximately equal to the least significant bit of the analog-to-digital converter, but different from the least significant bit of the analog-to-digital converter by an amount substantially equal to 1/N times the resolution of the analog-to-digital converter, the difference in amplitude between the highest and the lowest in amplitude of the discrete amplitude levels being approximately equal to N times the least significant bit of the analog-to-digital converter;

means for additively combining the discrete amplitude level signal and the analog signal to provide a combined signal to the analog-to-digital converter;

means for rendering the analog-to-digital converter operative to provide a digital representation of the combined signal for each discrete amplitude level of the discrete amplitude level signal; and means for additively combining the digital representations of the combined signal to provide the digital representations of the analog signal.

15. The improvement recited in claim 14 wherein said discrete level signal generating means includes means for generating a stepped signal.

16. The improvement recited in claim 14 wherein N is equal to 10.

17. The improvement recited in claim 14 wherein N is equal to 16.

18. In a conversion system employing an analog-to-digital converter for converting an analog signal to a corresponding digital signal, said analog-to-digital converter having a predetermined resolution and linearity, and means for providing a digital representation of the analog signal with a greater linearity than the linearity of the analog-to-digital converter, the improvement comprising:

means for generating a signal having a plurality N, of substantially equally spaced discrete amplitude levels, the difference in amplitude between the closest in amplitude of the discrete amplitude signals being approximately equal to the least significant bit of resolution of the analog-to-digital, converter but being different from the least significant bit of the analog-to-digital converter by a fraction of the least significant bit of the analog-to-digital converter, the denominator of said fraction being equal to the number of discrete amplitude levels, and the difference in amplitude between the lowest and highest in amplitude of the discrete amplitude levels being substantially greater than the least significant bit of the analog-to-digital converter;

means for additively combining the discrete amplitude level signal and the analog signal to provide a combined signal to the analog-to-digital converter;

means for rendering the analog-to-digital converter operative to provide a digital representation of the combined signal for each discrete amplitude level of the discrete amplitude level signal; and means for additively combining the digital representations of the combined signal to provide the digital representations of the analog signal.

19. The analog-to-digital conversion system recited in claim 18 wherein said discrete level signal generating means includes means for generating a stepped signal.

20. The analog-to-digital conversion system recited in claim 18 wherein N is equal to 10.

21. The analog-to-digital conversion system recited in claim 18 wherein N is equal to 16.

* * * * *